US 6,571,728 B1

(12) United States Patent
Abiko

(10) Patent No.: US 6,571,728 B1
(45) Date of Patent: Jun. 3, 2003

(54) PROCESS FOR PRODUCING ORGANIC ELECTROLUMINESCENT DISPLAY AND APPARATUS FOR PRODUCING THE SAME

(75) Inventor: Hiroshi Abiko, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 0 days.

(21) Appl. No.: 09/548,620

(22) Filed: Apr. 13, 2000

(30) Foreign Application Priority Data

Apr. 21, 1999 (JP) .......................................... 11-113195

(51) Int. Cl.[7] .......................... C23C 14/00; C23C 14/24; C23C 14/30
(52) U.S. Cl. ........................... 118/723 EB; 118/723 VE
(58) Field of Search .................... 118/723 EB, 723 VE, 118/715

(56) References Cited

U.S. PATENT DOCUMENTS 3,931,490 A * 1/1976 Grothe et al. ......... 219/121 EB
4,483,725 A * 11/1984 Chang ........................ 148/175
5,656,141 A * 8/1997 Betz et al. ............. 204/298.05
5,785,763 A * 7/1998 Onda et al. .......... 118/723 EB

FOREIGN PATENT DOCUMENTS

| JP | 62-27748 | * | 2/1987 |
| JP | 62-185875 | * | 8/1987 |
| JP | 5-205689 | * | 8/1993 |
| JP | 6-330292 | * | 11/1994 |
| JP | 7-211641 | * | 8/1995 |

* cited by examiner

*Primary Examiner*—Jeffrie R Lund
(74) *Attorney, Agent, or Firm*—Sughrue Mion, PLLC

(57) ABSTRACT

An apparatus and a process for producing an organic electroluminescent display without deteriorating its luminous efficiency are provided. The apparatus according to the present invention, in which a metal electrode is formed by electron beam evaporation method, contains a device for preventing secondary electrons generated at an evaporation source from reaching a display board. Thus, a layer of organic electroluminescent material formed on the display board is not damaged by the secondary electrons, thereby a luminous efficiency of the layer of organic electroluminescent material can be kept high without being deteriorated.

5 Claims, 3 Drawing Sheets

PROCESS FOR PRODUCING ORGANIC ELECTROLUMINESCENT DISPLAY AND APPARATUS FOR PRODUCING THE SAME

BACKGROUND OF THE INVENTION (1) Field of the Invention

This invention relates to a process and an apparatus for producing an organic electroluminescent display, more specifically, to a process and an apparatus for producing a metal electrode thereof.

(2) Description of the Related Art

As shown in FIG. 4, an organic electroluminescent display is constructed in such a manner that a transparent electrode 11 made of indium tin oxide (hereinafter, ITO), a layer of organic electroluminescent material 12 and a metal electrode 13 are laminated in order on a transparent board 10.

The metal electrode 13 is usually formed by electron beam evaporation method.

As shown in FIG. 5, a transparent board 10, on which a transparent electrode 11 and a layer of organic electroluminescent material 12 are formed, is set up in a vacuum chamber that is not shown in the figure, then electron beams 3A generated at an electron beam generator 3 are irradiated onto a metal electrode material 1 that is placed in a crucible 2 to form a metal electrode 13, thereby melting the metal electrode material 1 to generate the metal vapor and then, the generated metal vapor is evaporated onto the layer of organic electroluminescent material 12, thereby the metal electrode 13 is formed.

In such a case that the metal electrode 13 is formed by the above-mentioned electron beam evaporation method, as shown in FIG. 5, when the electron beams 3A are irradiated onto the metal electrode material 1, secondary electrons 4 are emitted from the metal electrode material 1 and collide against the layer of organic electroluminescent material 12.

The secondary electrons 4 collide against the layer of organic electroluminescent material 12, causing damage to the layer of organic electroluminescent material 12 and deteriorating a luminous efficiency thereof.

SUMMARY OF THE INVENTION

It is therefore an objective of the present invention to solve the above problem and to provide an apparatus for producing a metal electrode of organic electroluminescent display without deteriorating a luminous efficiency of a layer of organic electroluminescent material and a process for producing such a metal electrode.

In order to attain the above objective, a first aspect of the present invention is to provide an apparatus for producing an organic electroluminescent display, in which a metal electrode is formed by electron beam evaporation method, comprising a device for preventing secondary electrons generated at an evaporation source from reaching a display board.

Preferably, the device in the first aspect of the present invention forms a magnetic field in parallel with the display board between the display board and the evaporation source, whereby the magnetic field is formed in a direction crossing at right angles with electron beams irradiated onto the evaporation source.

The device to form a magnetic field is electrically insulated.

Further, the device in the first aspect of the present invention is a lattice-shaped electrode formed in parallel with the display board between the display board and the evaporation source, and a negative voltage is applied to the lattice-shaped electrode.

A second aspect of the present invention is to provide a process for producing an organic electroluminescent display, in which a metal electrode is formed by electron beam evaporation method, comprising the steps of: forming a magnetic field in parallel with a display board between the display board and an evaporation source; and evaporating a metal electrode material of the evaporation source onto the display board by electron beam evaporation method.

A third aspect of the present invention is to provide a process for producing an organic electroluminescent display, in which a metal electrode is formed by electron beam evaporation method, comprising the steps of: forming an electric field in a direction crossing at right angles with a display board between the display board and an evaporation source; and evaporating a metal electrode material of the evaporation source onto the display board by electron beam evaporation method.

DESCRIPTION OF THE PREFERRED EMBODIMENTS

In the following, the preferred embodiments of the present invention are explained with reference to the attached drawings.

First Preferred Embodiment

Figure 1A:
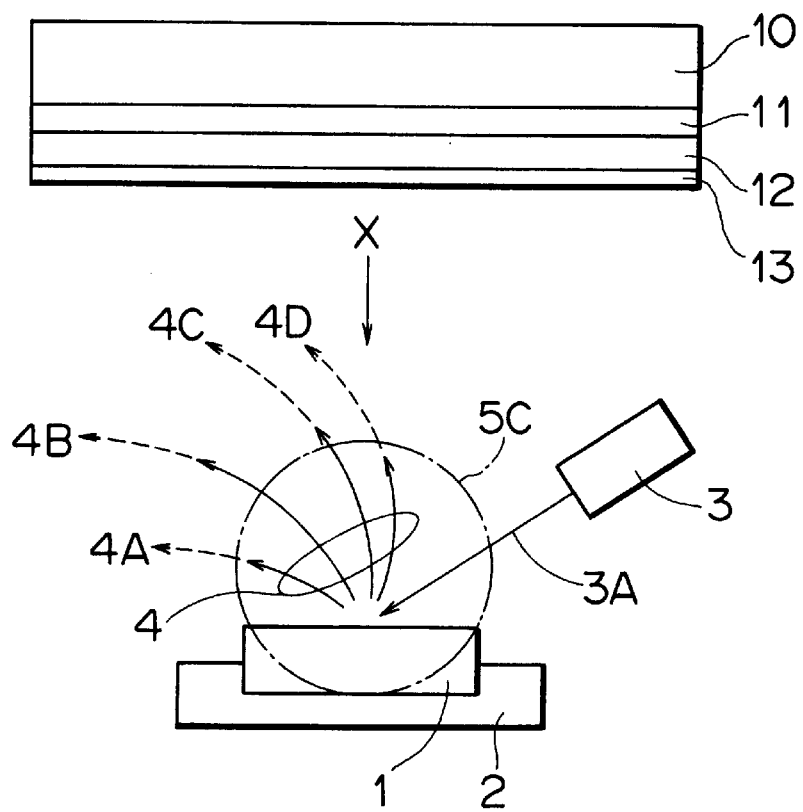
FIG. 1A is a side view illustrating a schematic construction for producing a metal electrode of an organic electroluminescent display according to a first preferred embodiment of the present invention.
Figure 1B:
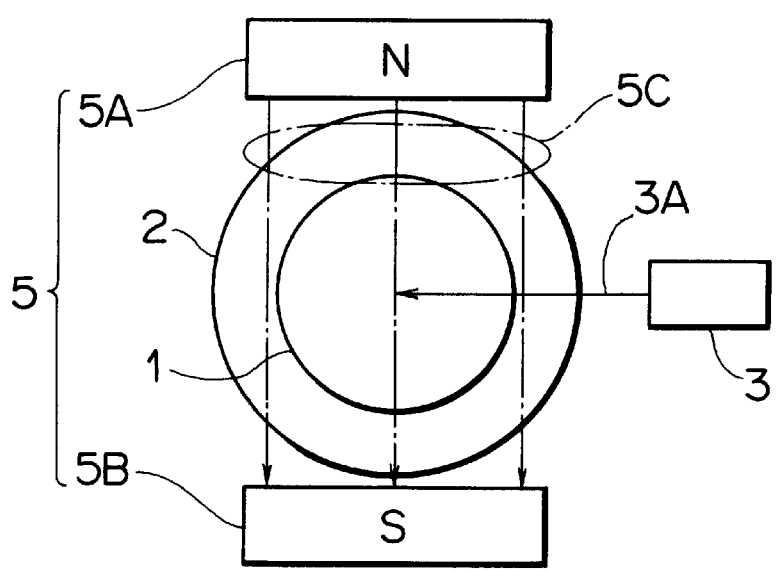
FIG. 1B is a top view viewed from X direction of FIG. 1A.

FIG. 1A is a side view illustrating a schematic construction for producing a metal electrode of an organic electroluminescent display according to the first preferred embodiment of the present invention and FIG. 1B is a top view of FIG. 1A viewed from X direction.

Figure 5:
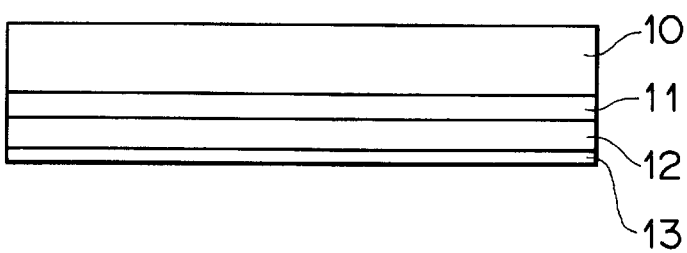
FIG. 5 illustrates a conventional construction for producing a metal electrode of an organic electroluminescent display by electron beam evaporation method.
Figure 5:
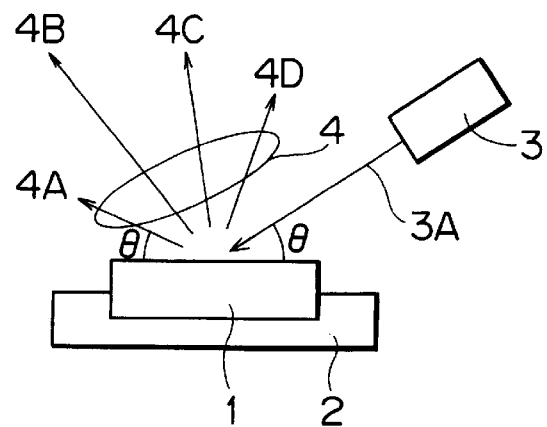

As shown in FIGS. 1A and 1B, in a vacuum chamber that is not shown in the figure, there are provided a metal electrode material 1 for forming a metal electrode 13, a crucible 2 in which the metal electrode material 1 is contained, an electron beam generator 3, a transparent board 10, a transparent electrode 11 and a layer of organic electroluminescent material 12, similarly to those that are shown in FIG. 5.

A point of difference between the first preferred embodiment according to the present invention and the conventional example that is explained with reference to FIG. 5 is that, as shown in FIG. 1B, a magnet 5 is set up in parallel with the transparent board 10 and also in a direction crossing at right angles with electron beams 3A generated from an electron beam generator 3 whereby a magnetic field 5C is formed.

When the electron beam 3A are irradiated onto the metal electrode material 1, secondary electrons 4A–4D are emitted as explained with reference to FIG. 5.

Although an emitting velocity of the secondary electrons is not uniform, as shown in FIG. 5, when an irradiation angle of the electron beams 3A is θ, the secondary electrons 4A having a reflection angle θ have relatively high velocity.

In the first preferred embodiment of the present invention, as shown in FIG. 1A, the electron beams 4A–4D thus emitted change their direction of movement being affected by a force under the Fleming's right-hand law, thereby preventing the. electron beams 4A–4D from reaching the transparent board 10.

According to the Fleming's right-hand law, when a magnetic field is applied in a direction crossing at right angles with secondary electrons emitted, the secondary electrons are affected by a force that is in proportion to the product of a strength of the magnetic field and an emitting velocity and that has a direction crossing at right angles with a plane, which is determined by a direction of the magnetic field and a direction of emission of the secondary electrons, then a direction of movement of the secondary electrons is changed by the magnetic force.

In this case, a radius of curvature r with regard to this change in the movement of the secondary electrons is expressed as follows:

$$r = mv/eB \quad (1)$$

where m is mass of an electron, v velocity of an electron (a component of velocity perpendicular to the magnetic field), e charge of an electron, and B strength of a magnetic field.

According to equation (1), a radius of curvature r is proportional to velocity of an electron v and inversely proportional to strength of a magnetic field B. In short, a strong magnetic field is needed in order to prevent electrons having high velocity from reaching the transparent board 10.

The magnet 5 is placed between the metal electrode material 1 and the transparent board 10. When the magnet 5 is set up near the transparent board 10, in order not to disturb an evaporation of the metal vapor onto the transparent board 10, a distance between the north pole 5A and the south pole 5B of the magnet 5 needs to be large, thereby decreasing the strength of the magnetic field.

On the other hand, when the magnet 5 is set up near the metal electrode material 1, the electron beams 3A generated from the electron beam generator 3 are bent by a magnetic field SC formed by the magnet 5.

Consequently, the magnet 5 is best set up near the metal electrode material 1 as much as possible within a limit that the electron beams 3A are not adversely affected by the magnetic field 5C.

The electrons that are trapped by the magnetic field 5C without reaching the layer of organic electroluminescent material 12 form an electron cloud between the metal electrode material 1 and the transparent board 10, which reduces the velocity of the secondary electrons emitted form the metal electrode material 1.

The magnet 5 is preferably electrically insulated from the surroundings so as to prevent the electrons forming the electron cloud from flowing out to the surroundings through the magnet 5.

Figure 2:
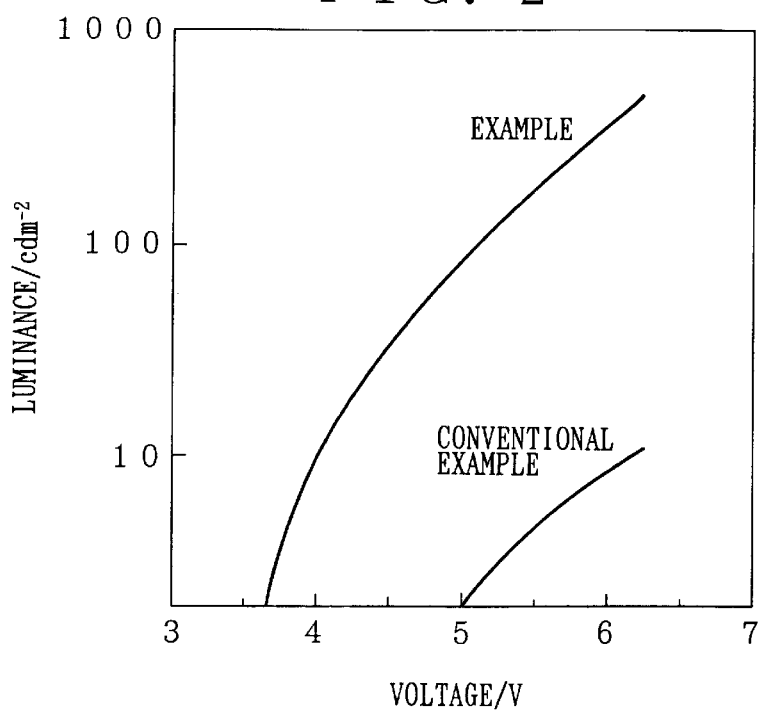
FIG. 2 illustrates voltage vs. luminance characteristics for an example of organic electroluminescent display according to the embodiment of FIGS. 1A and 1B along with a conventional example.

FIG. 2 illustrates voltage vs. luminance characteristics for an example of organic electroluminescent display according to the first preferred embodiment of the present invention along with a conventional example.

In this example according to the first preferred embodiment of the present invention, a transparent board on which ITO is formed is well washed, then layers of triphenyldiamine (TPD) having thickness of 60 nm and tris(8-quinolinolato)aluminum ($Alq_3$) having thickness of 55 nm are formed thereon by resistance heating evaporation method and then, a layer of Al—Li alloy having thickness of 100 nm is further formed thereon by using an apparatus that is described above with reference to FIGS. 1A and 1B, whereby an organic electroluminescent element having a size of 2 mm square is produced. FIG. 2 illustrates a voltage vs. luminance characteristic of thus produced organic electroluminescent element along with that of a conventional example. It is apparent that the application of the magnetic field during the formation of the metal electrode increases a luminous efficiency.

Second Preferred Embodiment

The second preferred embodiment of the present invention is explained with reference to FIGS. 3A and 3B.

Figure 3A:
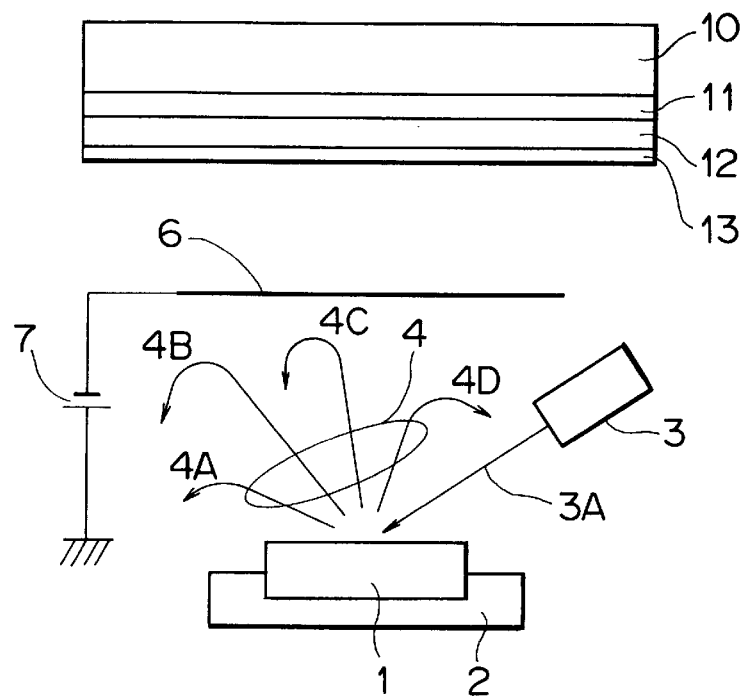
FIG. 3A is a side view illustrating a schematic construction for producing a metal electrode of an organic electroluminescent display according to a second preferred embodiment of the present invention.

As shown in FIG. 3A, in a vacuum chamber that is not shown in the figure, there are provided a metal electrode material 1 for forming a metal electrode 13, a crucible 2 in which the metal electrode material 1 is contained, an electron beam generator 3, a transparent board 10, a transparent electrode 11 and a layer of organic electroluminescent material 12, similarly to those that are explained in the first preferred embodiment with reference to FIGS. 1A and 1B.

A point of difference between the first preferred embodiment and the second preferred embodiment is that the magnet 5 is employed in the first preferred embodiment, on the other hand, that a lattice-shaped electrode 6 is placed in parallel with the transparent board 10 between the transparent board 10 and the metal electrode material 1 and a negative voltage is applied to the lattice-shaped electrode 6 by an electric power unit 7 in the second preferred embodiment.

Figure 3B:
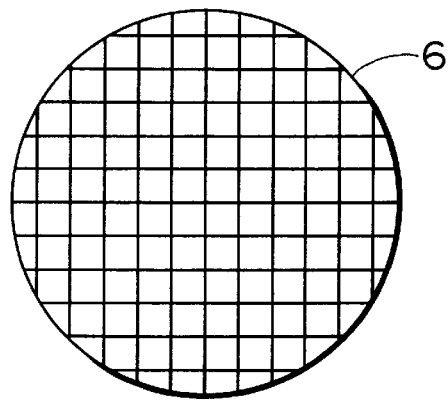
FIG. 3B is a top view of FIG. 3A.
Figure 4:
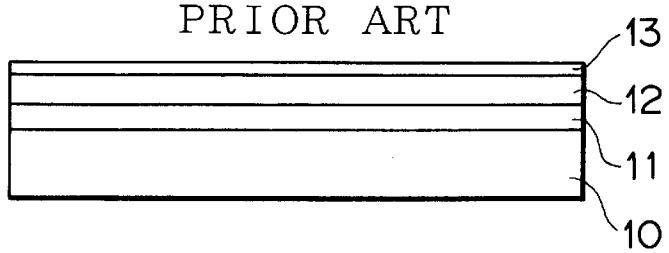
FIG. 4 is a cross sectional view of an organic electroluminescent display.

As shown in FIG. 3B, the lattice-shaped electrode 6 has a structure in which thin conductive electrical wires are arranged in a lattice-shape. The metal vapor passes through gaps of the lattice-shaped electrode 6 to reach the transparent board 10.

Since a negative voltage is applied to the lattice-shaped electrode 6 by an electric power unit 7, the secondary electrons 4A–4D emitted from the metal electrode material 1 are affected by repulsive forces there and are forced back, thereby being prevented from reaching the transparent board 10.

Thus, when the metal electrode of the organic electroluminescent display is formed by irradiating electron beams onto the metal electrode material in order to evaporate the metal electrode material, the device for preventing secondary electrons generated at the evaporation source from reaching the display board is provided between the evaporation source and the display board, resulting in that the layer of organic electroluminescent material thus formed on the display board is not damaged by the secondary electrons and that the luminous efficiency of the layer of organic electroluminescent material can be kept high without being deteriorated.

What is claimed is:

1. An apparatus for producing an organic electroluminescent display, in which a metal electrode is formed by electron beam evaporation method, comprising a magnetic device for preventing secondary electrons generated at an evaporation source from reaching a display board, wherein said magnetic device is electrically insulated from surroundings.

2. The apparatus for producing an organic electroluminescent display according to claim 1, wherein the device forms a magnetic field in parallel with the display board between the display board and the evaporation source.

3. The apparatus for producing an organic electroluminescent display according to claim 2, wherein the magnetic field is formed in a direction crossing at right angles with electron beams irradiated onto the evaporation source.

4. The apparatus for producing an organic electroluminescent display according to claim 1, wherein said evaporation source includes a crucible and a metal electrode material disposed in said crucible.

5. The apparatus for producing an organic electroluminescent display according to claim 1, wherein a portion of said magnetic device that is closest to said display board is located closer to said evaporation source than to said display board.

* * * * *